US009953865B1

(12) United States Patent
Briggs et al.

(10) Patent No.: US 9,953,865 B1
(45) Date of Patent: Apr. 24, 2018

(54) STRUCTURE AND METHOD TO IMPROVE FAV RIE PROCESS MARGIN AND ELECTROMIGRATION

(71) Applicant: International Business Machines Corporation, Armonk, NY (US)

(72) Inventors: Benjamin David Briggs, Waterford, NY (US); Joe Lee, Albany, NY (US); Theodorus Eduardus Standaert, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/335,122

(22) Filed: Oct. 26, 2016

(51) Int. Cl.
H01L 21/76 (2006.01)
H01L 21/768 (2006.01)
H01L 23/522 (2006.01)
H01L 23/528 (2006.01)
H01L 23/532 (2006.01)

(52) U.S. Cl.
CPC .. *H01L 21/76831* (2013.01); *H01L 21/76816* (2013.01); *H01L 21/76877* (2013.01); *H01L 23/528* (2013.01); *H01L 23/5226* (2013.01); *H01L 23/53228* (2013.01)

(58) Field of Classification Search
CPC ......... H01L 21/76831; H01L 21/76816; H01L 23/53228; H01L 23/5226; H01L 23/528; H01L 21/76877; H01L 21/76808; H01L 21/76813
See application file for complete search history.

(56) References Cited

U.S. PATENT DOCUMENTS

| 8,614,144 | B2 | 12/2013 | Kato |
| 9,324,650 | B2 | 4/2016 | Edelstein et al. |
| 9,362,165 | B1 | 6/2016 | Bouche et al. |
| 2009/0200683 | A1 | 8/2009 | Colburn et al. |
| 2013/0216776 | A1 | 8/2013 | Arnold et al. |
| 2013/0328208 | A1* | 12/2013 | Holmes ............ H01L 21/76883 257/774 |
| 2014/0024220 | A1 | 1/2014 | Chang et al. |
| 2014/0151893 | A1 | 6/2014 | Boyanov et al. |
| 2014/0363969 | A1 | 12/2014 | Chen et al. |
| 2015/0091181 | A1 | 4/2015 | Li et al. |

(Continued)

OTHER PUBLICATIONS

Anonymous, "Bi-directionally self-aligned vias", IPCOM000231097D Sep. 26, 2013.

(Continued)

*Primary Examiner* — Roy Potter
*Assistant Examiner* — Paul Patton
(74) *Attorney, Agent, or Firm* — Vazken Alexanian; McGinn IP Law Group, PLLC

(57) ABSTRACT

A method of forming fully aligned vias in a semiconductor device includes forming an Mx level interconnect line embedded in an Mx interlevel dielectric (ILD). The Mx level interconnect is recessed below the Mx interlevel dielectric or a dielectric is selectively deposited on the Mx interlevel dielectric. The method also includes laterally etching the exposed upper portion of the Mx interlevel dielectric bounding the recess or laterally etching the selectively deposited dielectric. A dielectric cap layer and an Mx+1 level interlevel dielectric is deposited on top of the Mx interlevel dielectric, and a via opening is formed.

20 Claims, 22 Drawing Sheets

(56) References Cited

U.S. PATENT DOCUMENTS

2015/0171010 A1    6/2015  Bristol et al.
2015/0364420 A1*  12/2015  Lin .................... H01L 23/5283
                                                             257/775
2016/0190009 A1    6/2016  Wallace et al.

OTHER PUBLICATIONS

Anonymous, "A Structure and Method for bi-directionally self-aligned vias (bSAV)", IP.com No. IPCOM000201787D, Nov. 23, 2010.
Briggs et al., "Structure and Method for Selective Fully Aligned via (FAV)", IBM Disclosure YOR8-2015-1873, Oct. 8, 2015.
Nag et al., "Structure and Method for Self-Aligned Inverted via Interconnect", IBM Disclosure FIS8-2014-0395, Aug. 28, 2014.
Yang et al., "Structure and fabrication of the same: Interconnect structure", IBM Disclosure YOR8-2013-1864., Dec. 9, 2013.

* cited by examiner

STRUCTURE AND METHOD TO IMPROVE FAV RIE PROCESS MARGIN AND ELECTROMIGRATION

BACKGROUND OF THE INVENTION

Field of the Invention

The present invention relates generally to a method, system, and apparatus for a semiconductor using fully aligned via (FAV) reactive ion etching (RIE), and more particularly relates to a method, system, and apparatus to improve FAV RIE process margin and Electromigration resistance.

Description of the Related Art

The fabrication of Very-Large Scale Integrated (VLSI) requires an interconnect structure including metallic wiring that connects individual devices in a single semiconductor chip. With the chip being massively reduced in size over the years, the interconnect structure has also been reduced accordingly. The via levels are one of the most challenging to print. Additionally, there are overlay errors that result from misalignment during the lithography. The overlay errors may lead to reliability issues.

A failure for interconnects that may be dependent on overlay error of lithographic patterns, are electromigration (EM) and time-dependent dielectric breakdown (TDDB). Overlay errors in the related art result in reduced spacing between the via and the metal level below, and therefore increase the dielectric field. There is a need to provide a technique of reducing the spacing variation.

There is a need to providing a technique of forming a fully aligned via that is more efficient and avoids affecting yield and reliability issues such that there is an improvement in process margin and Electromigration resistance.

SUMMARY OF INVENTION

In view of the foregoing and other problems, disadvantages, and drawbacks of the aforementioned background art, an exemplary aspect of the present invention provides a system, apparatus, and method of providing a method, system, and apparatus to improve FAV RIE process margin and Electromigration resistance.

One aspect of the present invention provides a method of forming fully aligned vias in a semiconductor device. The method includes forming an Mx level interconnect line embedded in an Mx interlevel dielectric (ILD). The Mx level interconnect line is recessed below the Mx interlevel dielectric or a dielectric is selectively deposited on the Mx interlevel dielectric. The method also includes laterally etching the exposed upper portion of the Mx interlevel dielectric bounding the recess or laterally etching the selectively deposited dielectric. The method further includes depositing a dielectric cap layer and an Mx+1 level interlevel dielectric on top of the Mx interlevel dielectric, and forming a via opening.

Another aspect of the present invention provides a semiconductor device including an Mx interlevel dielectric (ILD), an Mx level interconnect line embedded in the Mx interlevel dielectric, and an Mx+1 level ILD formed on the Mx interlevel dielectric and the Mx level interconnect line. The Mx interconnect line is recessed below the Mx interlevel dielectric. The Mx interlevel dielectric includes an exposed upper portion bounding the recess, a dielectric cap layer deposited on the Mx interlevel dielectric, and the Mx level interconnect line.

Yet another aspect of the present invention provides a semiconductor device including an Mx interlevel dielectric (ILD), an Mx level interconnect line embedded in the Mx interlevel dielectric, a dielectric layer selectively formed on the Mx interlevel dielectric and laterally etched to bound a via, a dielectric cap layer, and an Mx+1 level ILD. The dielectric cap layer is deposited on the Mx interlevel dielectric, the via, the Mx level interconnect line, and the dielectric layer. The Mx+1 level ILD is formed on the Mx interlevel dielectric, the dielectric layer, and the Mx level interconnect line.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

BRIEF DESCRIPTION OF DRAWINGS

The exemplary aspects of the invention will be better understood from the following detailed description of the exemplary embodiments of the invention with reference to the drawings.

DETAILED DESCRIPTION OF A PREFERRED EMBODIMENTS

Figure 1A:
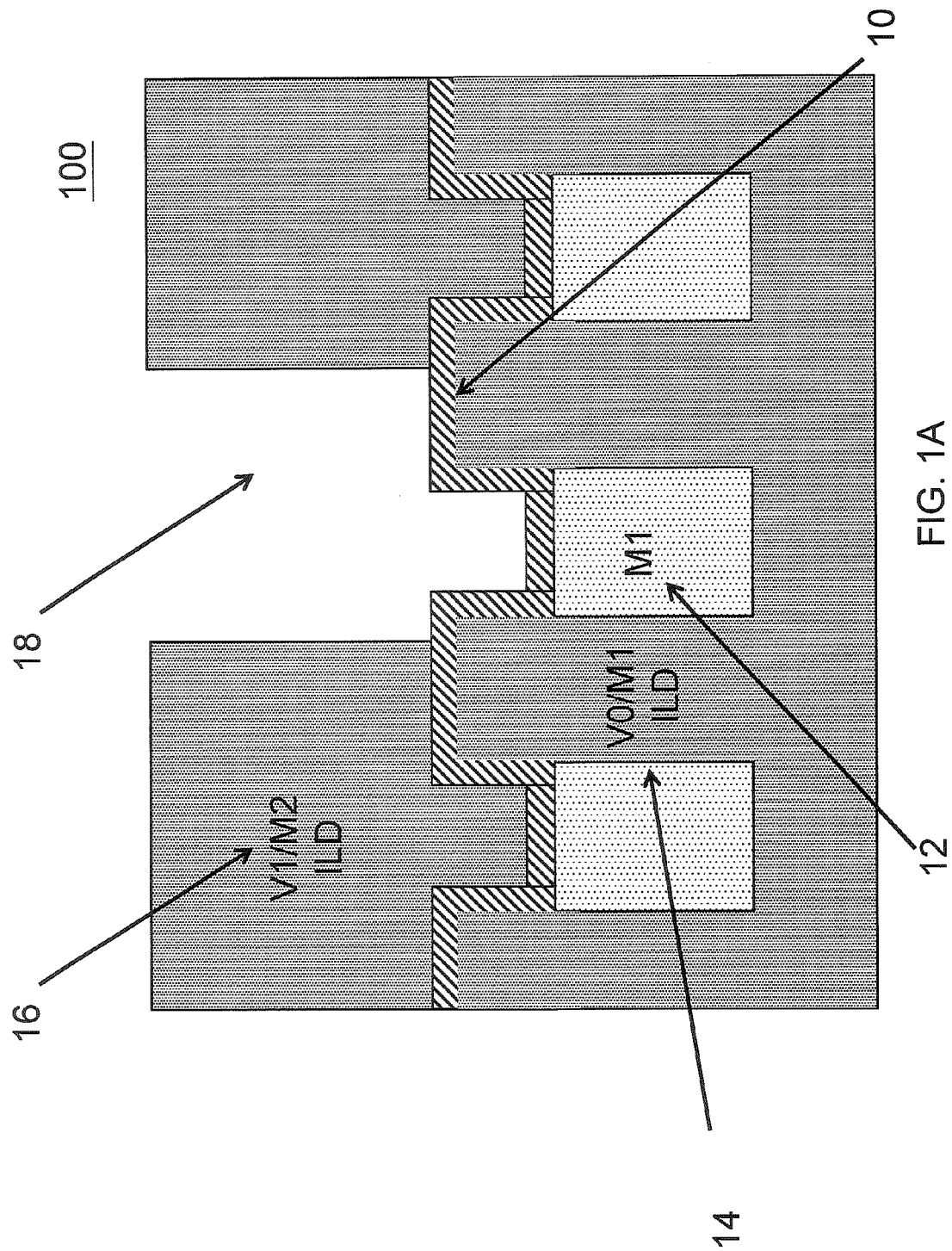
FIG. 1A illustrates a FAV RIE of the related art.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

As mentioned, fabrication of VLSI requires an interconnect structure including metallic wiring that connects individual devices in the single semiconductor chip. The wiring interconnect network can include certain features that function as electrical conductors. A metal line can go across the chip, and a via can connect lines in different levels. The metal lines and vias can include, for example, copper or other substance and are insulated by the interlayer dielectrics (ILD, also referred to as interlevel dielectric) that function as electrical insulators. The ILD is made of a dielectric material used to electrically separate closely spaced interconnect lines arranged in several levels.

With the chip being massively reduced in size over the years, the interconnect structure has also been reduced accordingly. The via levels are one of the most challenging to print. Additionally, there are overlay errors that result from misalignment during the lithography. The overlay errors may lead to reliability issues.

A failure for interconnects that may be dependent on overlay error of lithographic patterns, are electromigration (EM) and time-dependent dielectric breakdown (TDDB). Electromigration is, for example, a transport of material from a gradual movement of the ions in a conductor due to the momentum transfer between conducting electrons and diffusing metal atoms. Electromigration failure results when a void forms in the metal feature through metal diffusion leading to a short in the circuitry. If the wiring is constructed such that the intersection between the via and line is too small, smaller voids formed by electromigration can lead to failure.

Overlay errors in the related art result in reduced spacing between the via and the metal level below, and therefore increase the dielectric field. As mentioned, there is a need to provide a technique of reducing the spacing variation.

Via contact resistance is a performance-limiting factor for nanofabrication technologies. Dual-damascene fill requires physical vapor deposition liner/barrier deposition displacing primary conductor, a major contributing factor to via resistance. It is difficult to build a self-aligned fine pitch via.

Fully aligned via (FAV) reactive ion etching (RIE is an emerging technology that has many benefits, but has many challenges. Recess of prior metal level or selective dielectric growth of the prior ILD (Interlevel or Interlayer Dielectric) creates the desired structure to enable FAV. However, anisotropically etching of the dielectric barrier cap from the via structure is very challenging and may actually result in the loss of the desired structure that enables FAV.

Isotropic or partially isotropic cap etch is not an option as there are subsequent metallization issues. Undercutting during the process poses serious yield and reliability concerns.

The following provides a technique of forming a fully aligned via that is more efficient and avoids affecting yield and reliability issues such that there is an improvement in process margin and Electromigration resistance.

FIG. 1A through 1D illustrates a FAV RIE of related art where cap etch is performed and pull-down is selective to interlevel dielectric, to ensure full contact area. A dielectric etch selective to the cap is performed in FIG. 1A. The semiconductor structure 100 includes the interlevel dielectric at Via 1/metal level 2 (V1/M2) 16 formed on the cap 10. In addition, there is interlevel dielectric at Via 0/metal level 1 (V0/M1) 14 formed adjacent to first level of metal (M1) 12. The dielectric ILD at V1/M2 16 is etched selectively to the cap 10 as seen in area 18.

Figure 1B:
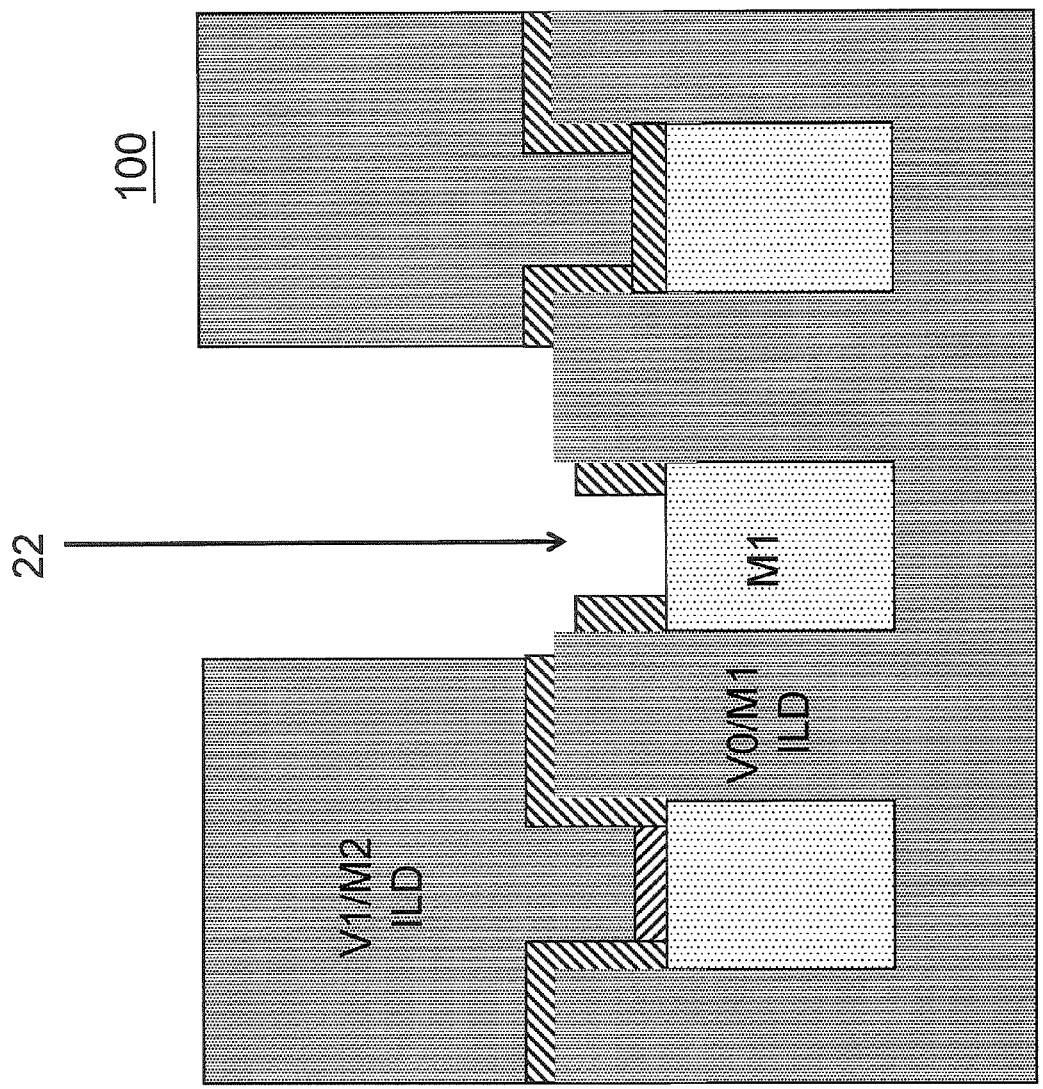
FIG. 1B illustrates a further process of FAV RIE of the related art.

Referring to FIG. 1B, then one drills down a via to the M1 line as seen in point 22. Then the idea is to open up the cap layer as seen at point 22. As seen further in area 24 in FIG. 1C, the Cap layer is further pulled down.

However, the cap etch is challenging and pull down selective to interlevel dielectric to ensure a full contact area. In fact, a full pull down selective to the interlevel dielectric is necessary to ensure a full contact area. Typically there is a direct etch, then form a spacer, and then to pull the spacer. In such an etch sequence, the directional etch first forms a spacer which then has to be pulled down completely.

Figure 1C:
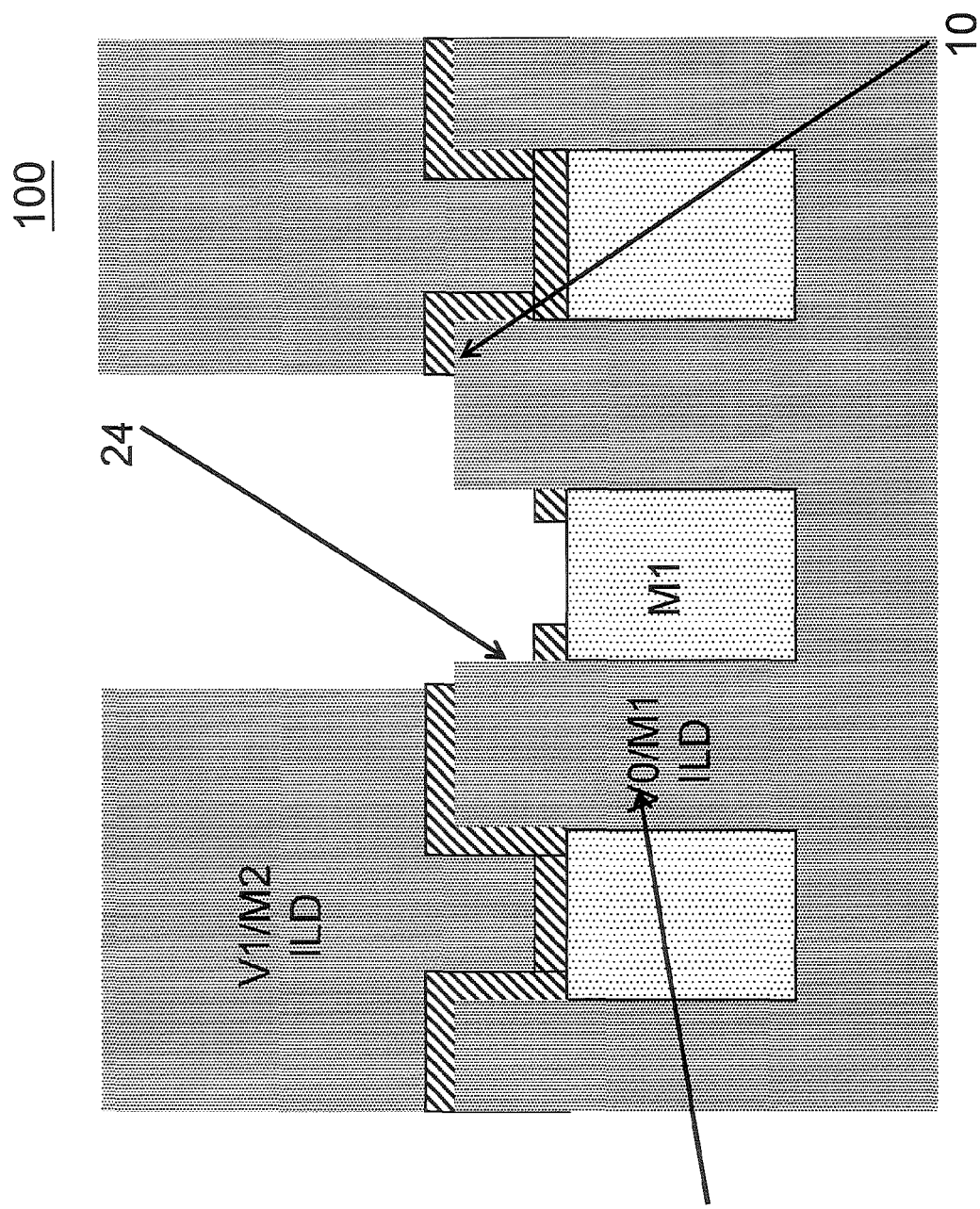
FIG. 1C illustrates a further process of FAV RIE of the related art.
Figure 1D:
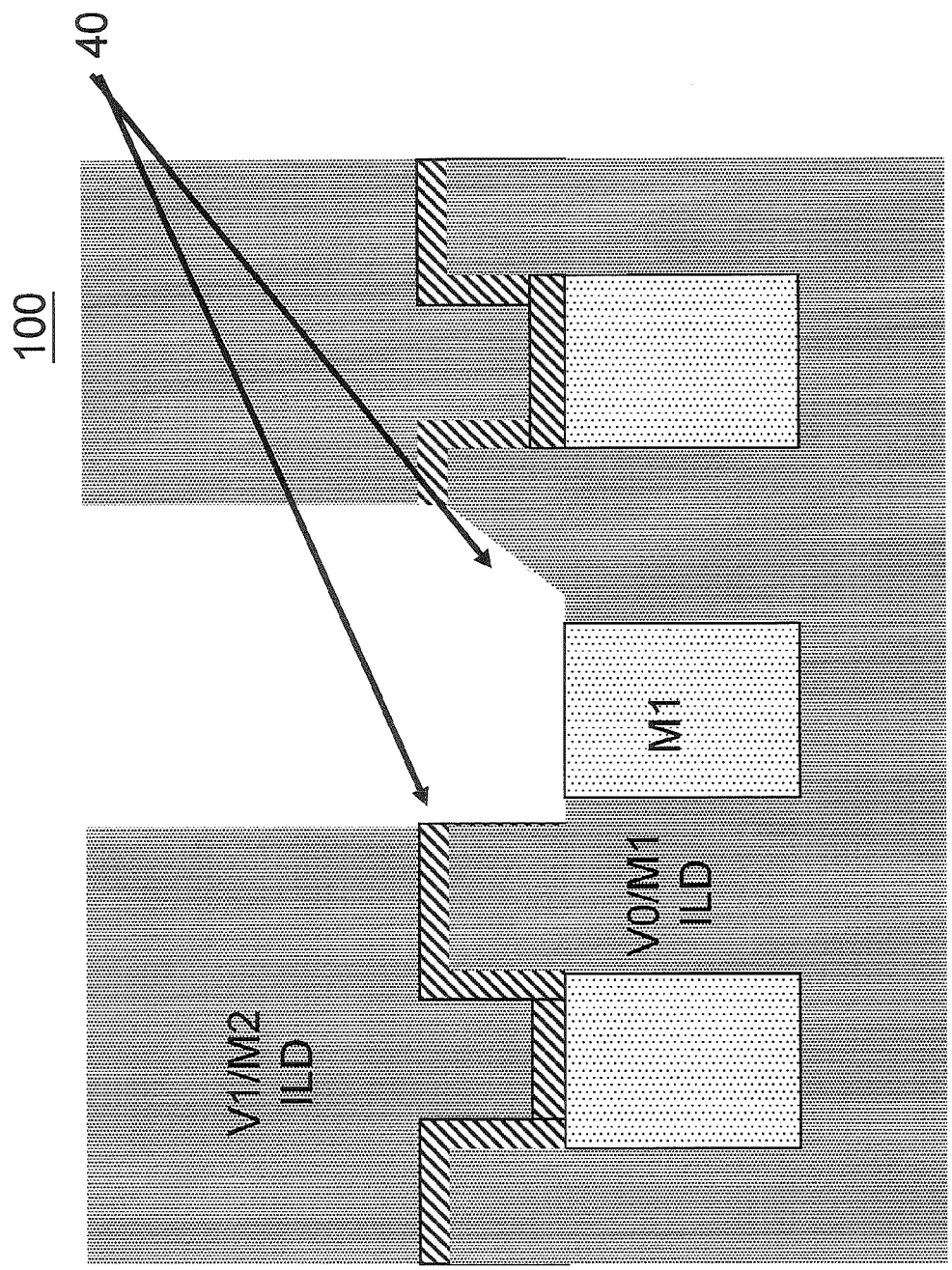
FIG. 1D illustrates a further process of FAV RIE of the related art.

However, during the process as seen in FIG. 1D, the corners suffer damage as shown as the corners are rounded as seen in noted area 40. There is CD (critical dimension) loss above the M1 shape. It is desirable to avoid such problems.

Figure 2:
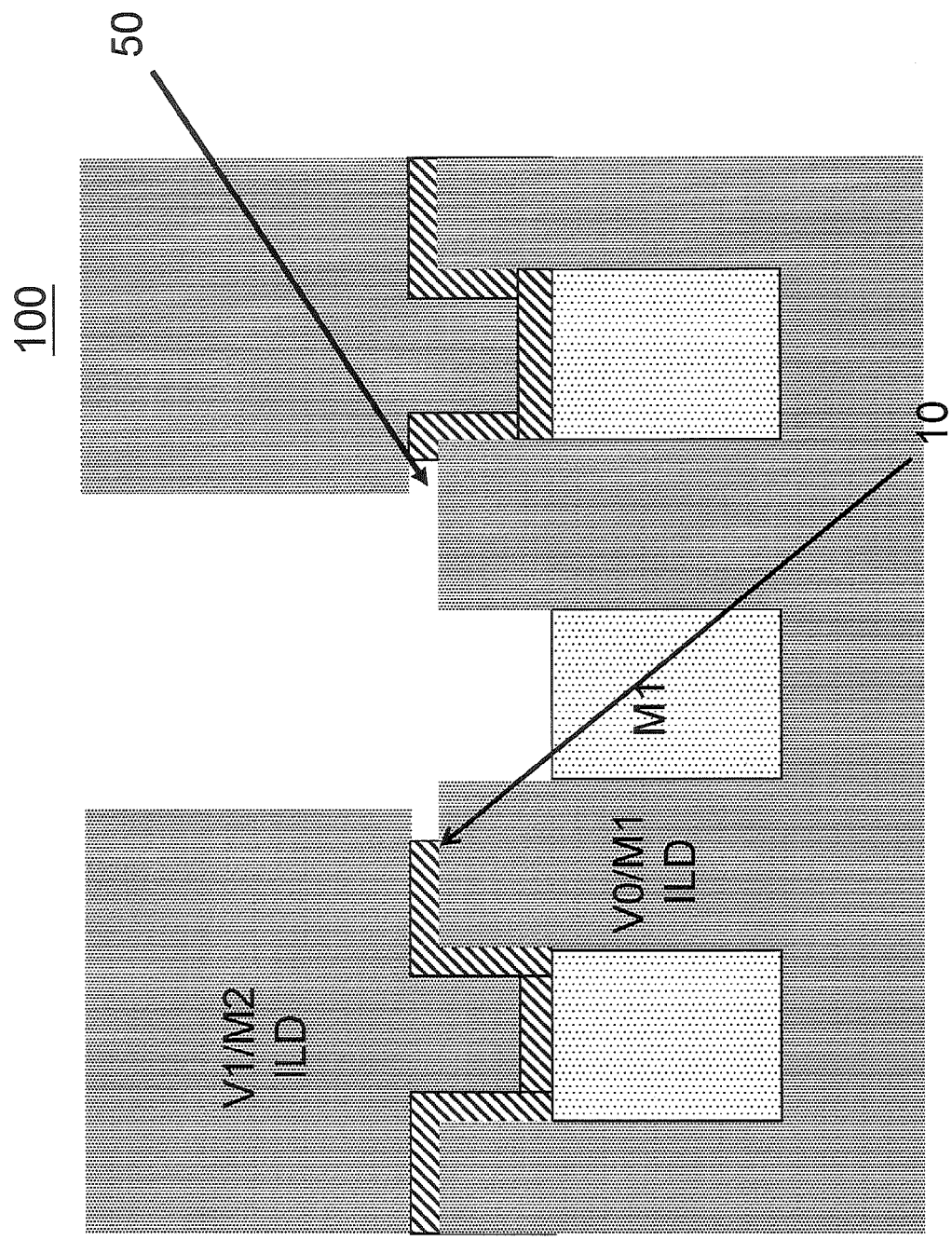
FIG. 2 illustrates another process of FAV RIE of the related art.

FIG. 2 illustrates another process of FAV RIE of related art. From a starting point of FIG. 1A, an isotropic or partially isotropic cap etch is performed in FIG. 2. Therefore, instead of doing a dielectric etch selective to the cap as seen in FIGS. 1B through 1D, instead perform an isotropic etch or partially isotropic etch. This is not an option because of subsequent metallization issues. The cap 10 is removed very quickly, but you also undercut as shown in area 50. As seen from area 50, the undercut poses serious yield and reliability issues.

Figure 3A:
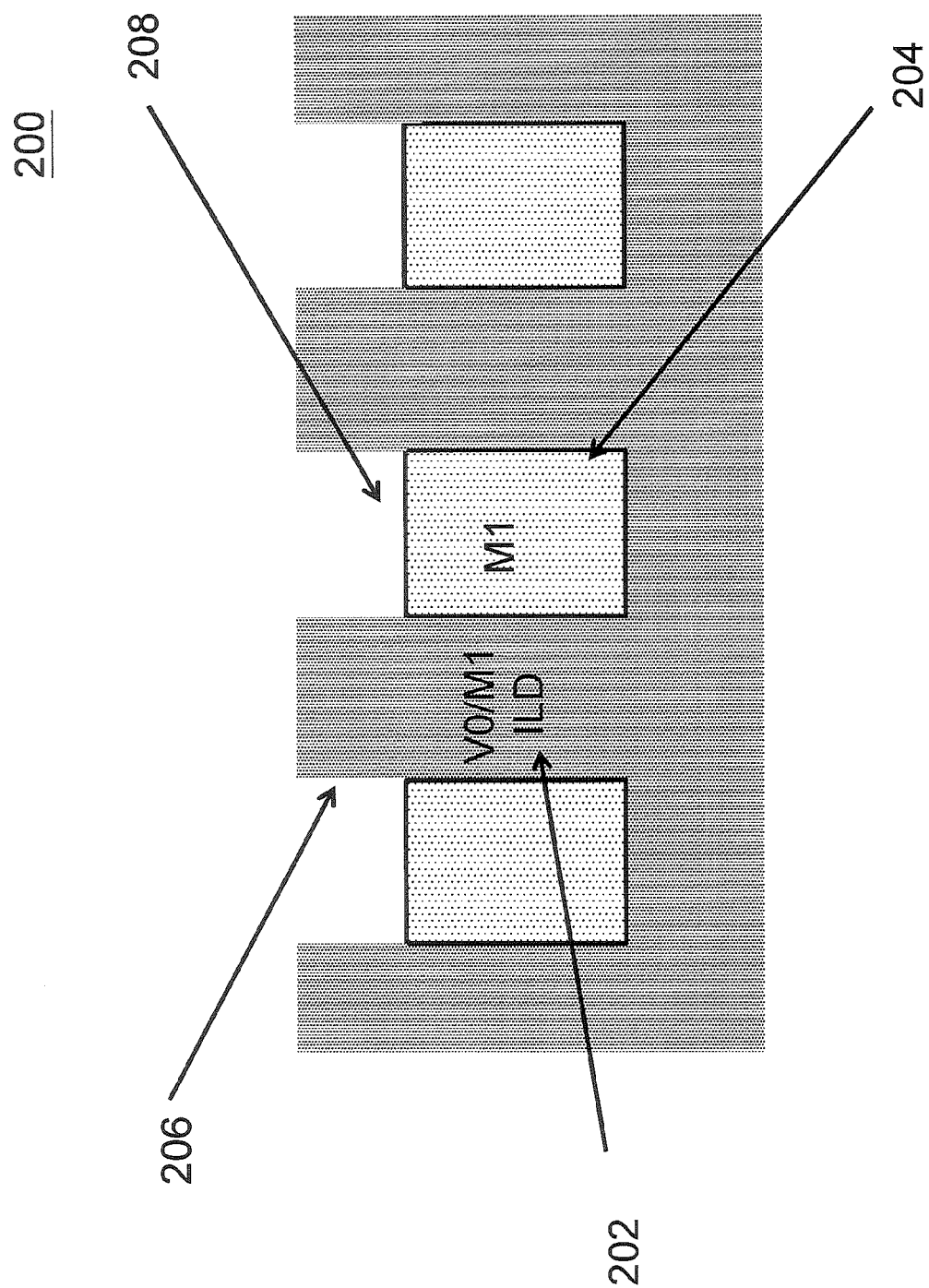
FIG. 3A illustrates a metal recess of FAV RIE in an exemplary embodiment.

FIG. 3A illustrates a metal recess of FAV RIE of an exemplary embodiment. First, one starts with a complete damascene Cu level (after CMP, chemical mechanical polishing) 200. Then the technique includes recessing the prior metal level. There is interlevel dielectric at Via 0/metal level 1 (V0/M1) 202 formed adjacent to first level of metal (M1) 204. The metal layer 204 is recessed as seen in area 208, thereby exposing a top portion 206 of the ILD 202.

Figure 3B:
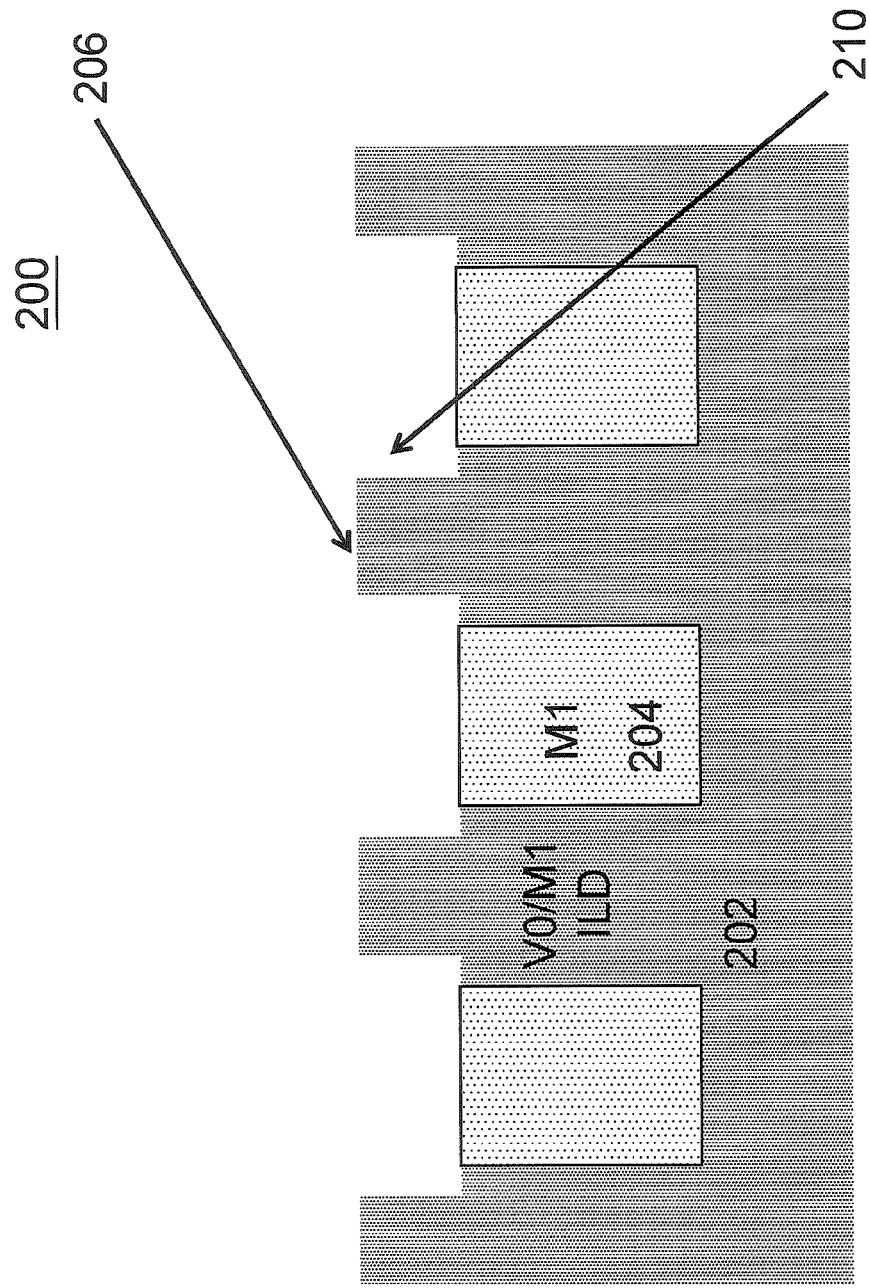
FIG. 3B illustrates a trimming in the exemplary embodiment.

FIG. 3B illustrates a trimming in the exemplary embodiment. As seen in area 210, each of the exposed areas 206 of the ILD 202 at V0/M1 are trimmed laterally. The trimming of the ILD 202 is performed prior to cap deposition, which enables full via opening without pulling down the cap layer. Therefore, first create the metal recess as seen in FIG. 3A, and then do the ILD trim as seen in FIG. 3B. As seen in area 210, the shoulders of the ILD 202 are laterally etched.

Figure 3C:
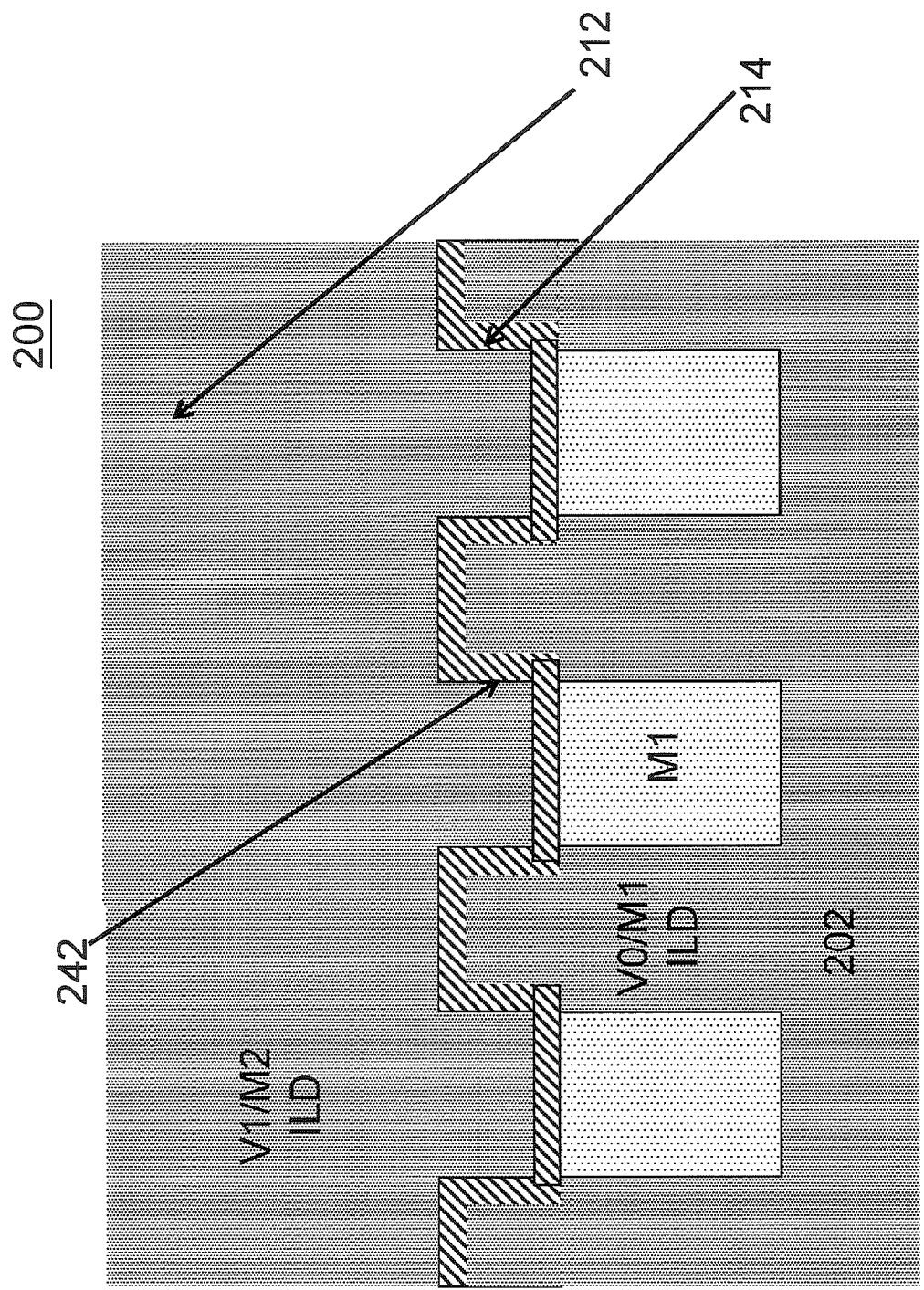
FIG. 3C illustrates a Cap and ILD in the exemplary embodiment.

FIG. 3C illustrates a Cap and ILD in the exemplary embodiment. The cap layer 214 is deposited. One can deposit, if necessary a selective metal cap, and then followed by the dielectric cap. Thereafter, the ILD stack can be deposited for a subsequent metal level as seen in ILD 212 at V1/M2.

Therefore, laterally etch the shoulders 210 of the ILD at V0/M1 202 and then deposit the cap 214 down, and then the ILD layer 212 at V1/M2.

Referring again to FIG. 3C, alternatively, instead of forming a metal recess as seen in FIG. 3A, a dielectric can be selectively grown. Therefore, instead of the metal layer 204 being recessed as seen in area 208, a dielectric is selectively grown. The selective growth of a dielectric material is then laterally trimmed. For example, the dielectric material ILD 202 or a different dielectric material can be selectively grown instead of the metal layer 204 being recessed. Then, the ILD 202 or a different dielectric material at V0/M1 can be laterally trimmed as seen in area 242. Trimming this selective portion would yield similar benefits but a different structure. Such an alternative embodiment is further clarified in FIG. 8 below.

Figure 3D:
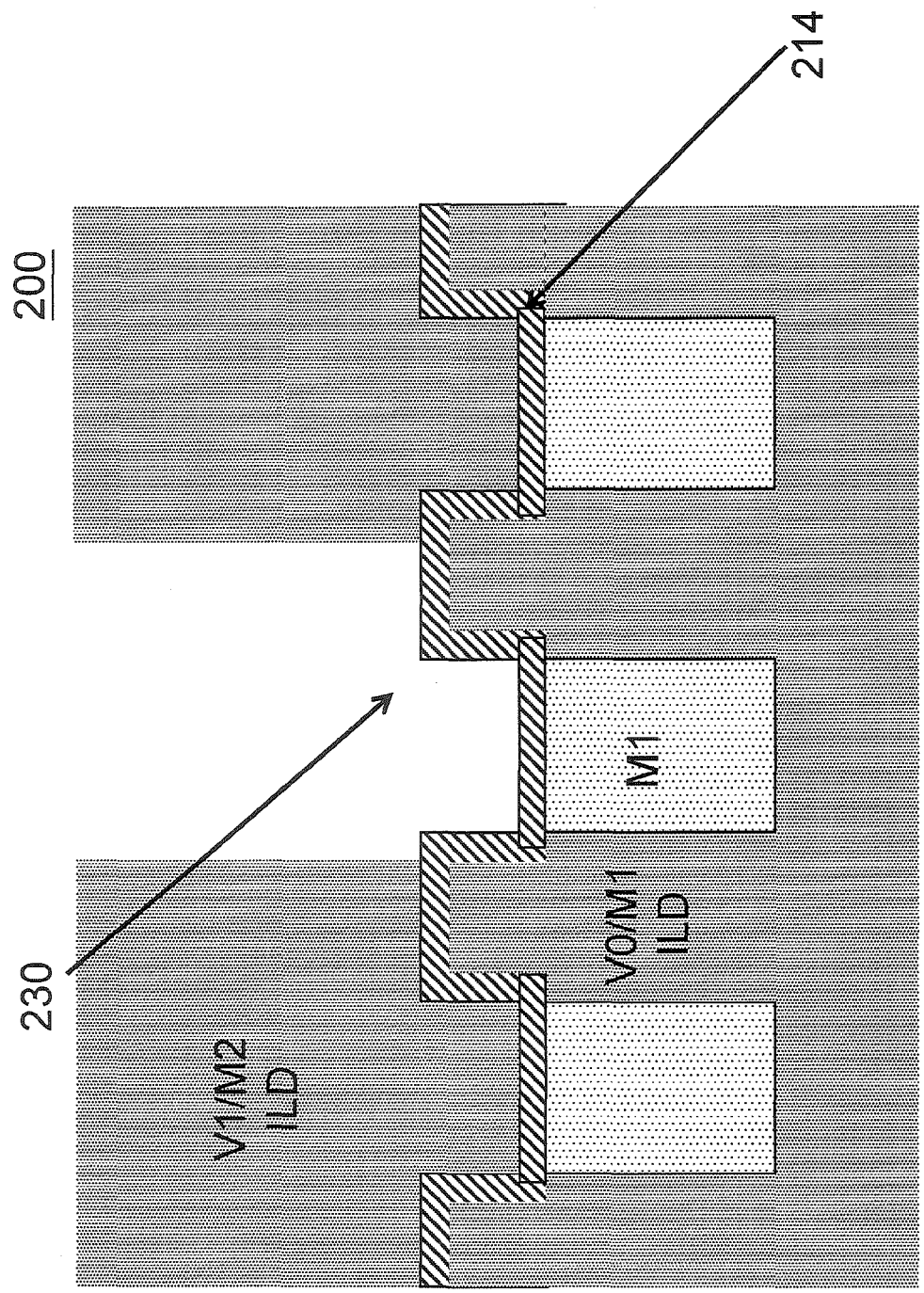
FIG. 3D illustrates a partial via RIE in the exemplary embodiment.

Referring to FIG. 3D illustrates a partial via being formed with RIE (reactive ion etching). As seen in area 230 above the cap area 214, a partial via is formed.

Figure 3E:
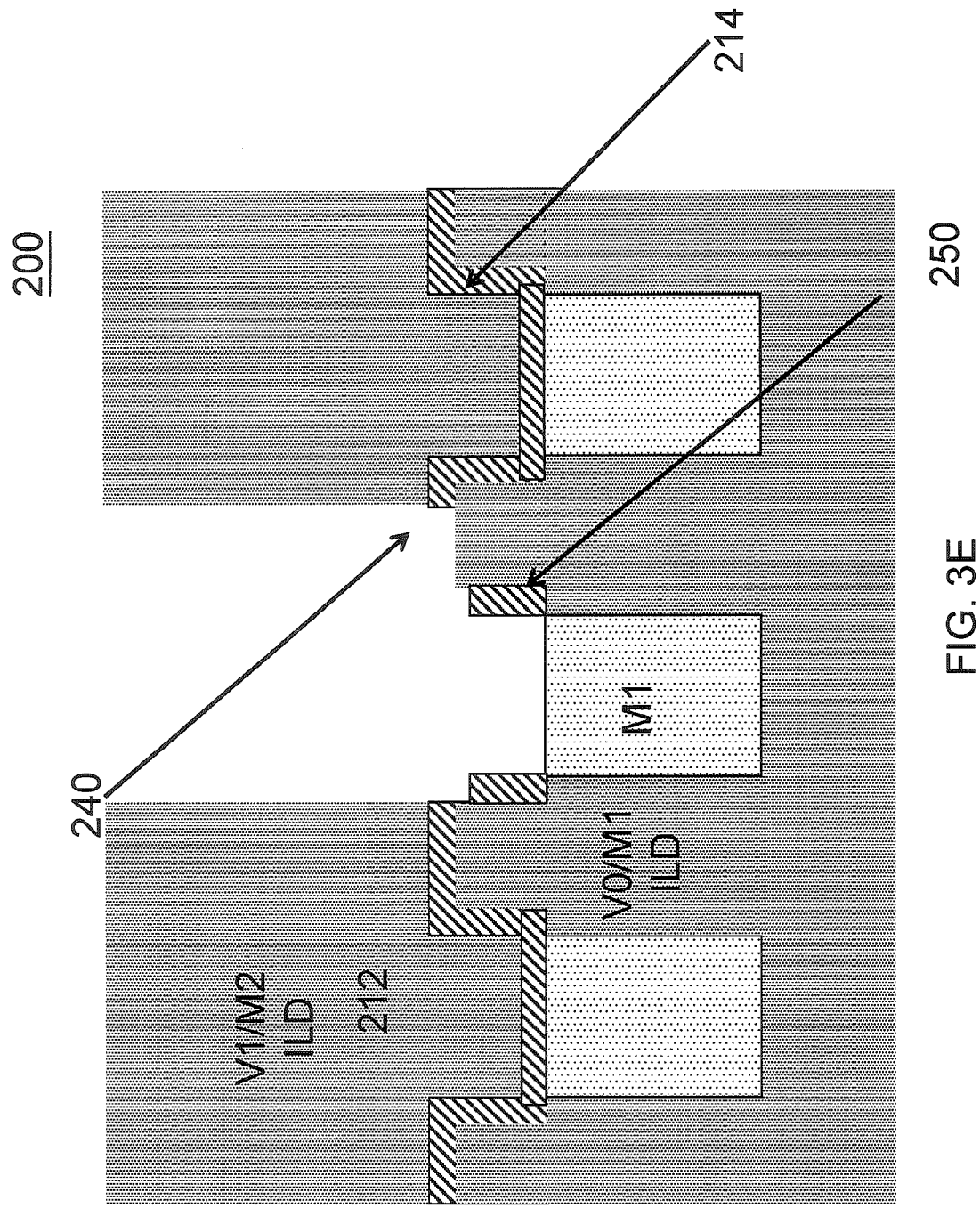
FIG. 3E illustrates a cap etch in the exemplary embodiment.

FIG. 3E illustrates a cap etch in the exemplary embodiment. The cap layer 214 is etched as seen in area 240, but without pulling down the cap layer. Therefore, unlike the related art, one does not need to pull the dielectric cap 214 down. One can just do a short cap open etch and leave the cap on the sidewall as seen in portion 250. The cap 214 is lining the sidewall of the ILD 212. The full opening in this case is still achieved, but without the problems of the related art. Therefore, this also makes the FAV RIE much easier.

Figure 4A:
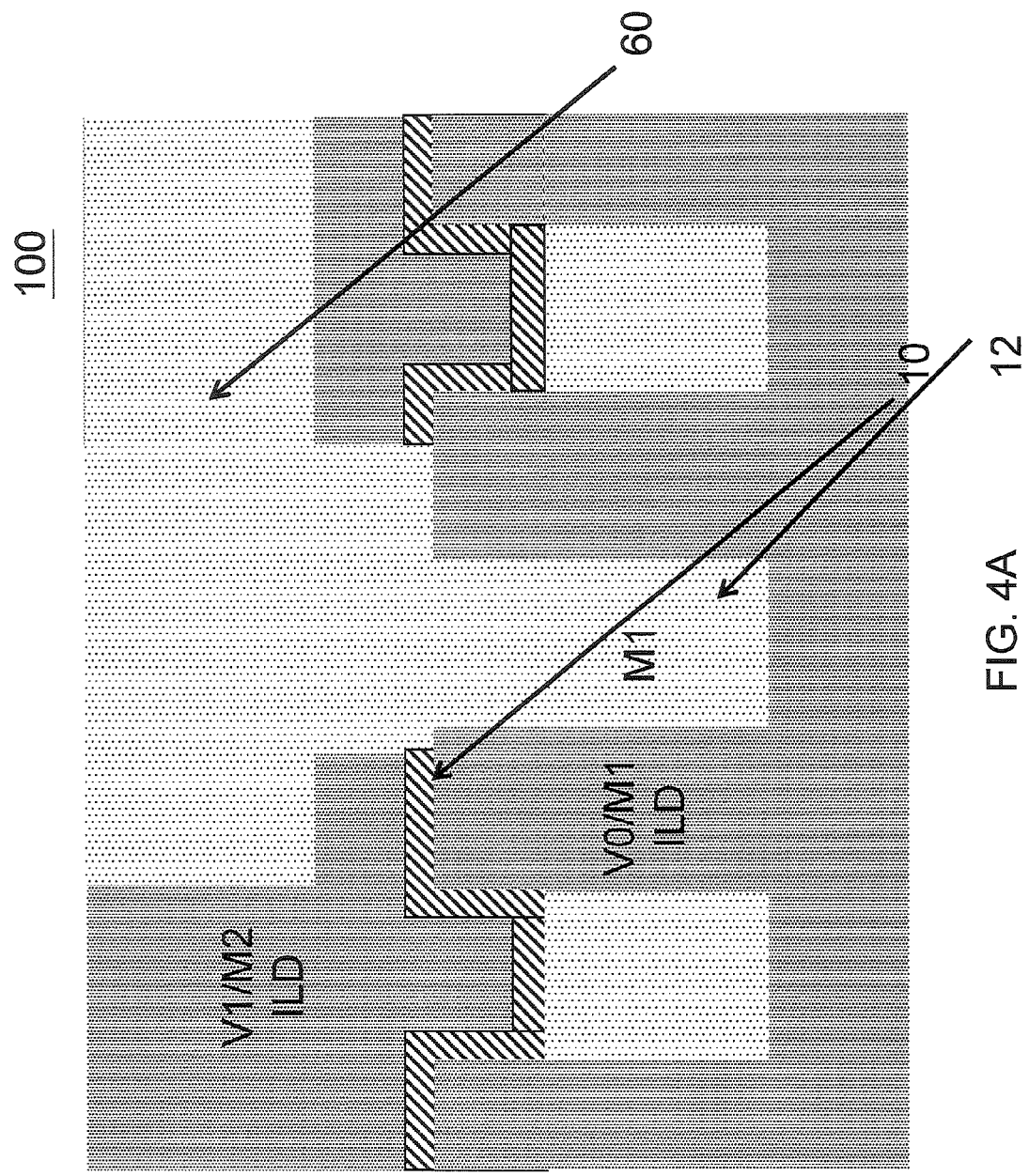
FIG. 4A illustrates a step performed where the corner rounding shown in FIG. 1D does not take place.

FIG. 4A illustrates a step performed where the corner rounding shown in FIG. 1D does not take place. After the step shown in FIG. 1D, but where the damage of corner rounding does not take place, additional metal layer 60 is deposited to form an extension to the metal layer 12 at M1 in the area where the metal layer 12 was recessed.

Figure 4B:
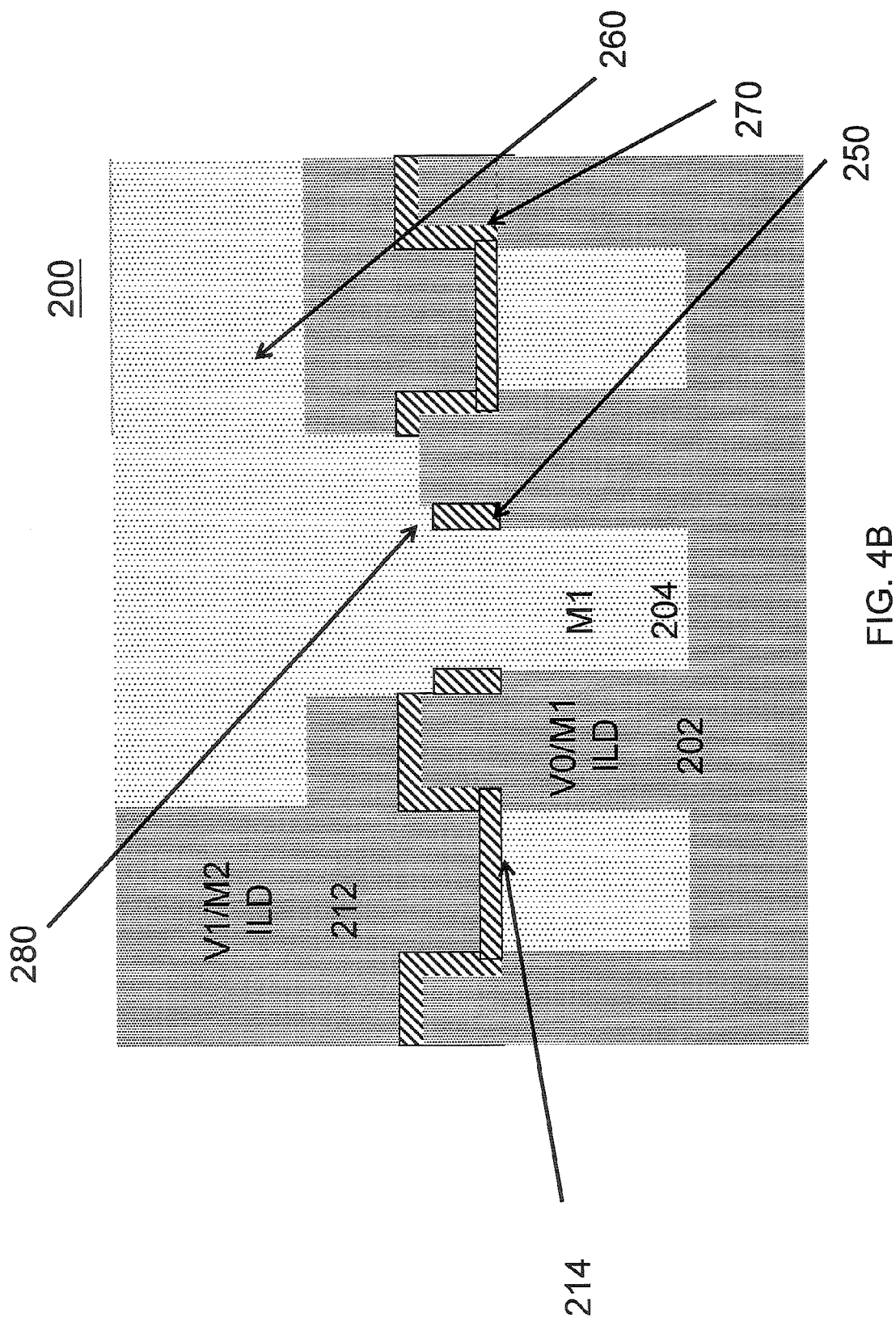
FIG. 4B illustrates the exemplary embodiment for comparison with FIG. 4A.

FIG. 4B illustrates the exemplary embodiment for comparison with FIG. 4A. After the step shown in FIG. 2E of the exemplary embodiment, additional metal layer 260 is deposited to form an extension to the metal layer 204 at M1 in the area where the metal layer 204 was recessed in order to complete the metallization. The cap layer in area 250 lines the via sidewall where the prior metal layer 204 was recessed.

The cap lining 250 results prevents excessive corner rounding of ILD 202 shoulder, which is one of the critical elements for FAV performance. The cap lining 250 does not degrade interconnect performance as a full contact area has been maintained. Additionally, there is better dielectric capping of Metal line corners, which is good for EM (electromigration).

The cap layer 214 overlaps Metal line corners as seen in area 270, thus allowing for more robust Cu passivation and improved Electromigration resistance. The cap layer lining via sidewall 250 is made without sacrificing via contact area and improving FAV performance.

Moreover, it can be seen how the cap layer 214 sits on top of the M1 metal layer 204 as the cap 214 overlaps now. The upper corners of the ILD 202 are tucked under the cap 214 as seen in area 280. On the other hand, the cap 10 sits at the corner in the related art of FIG. 4A. The corner of the ILD 202 in the exemplary embodiment of FIG. 4B is covered much better than the related art.

For electromigration, the fast diffusion path is typically at the top surface and especially at those metal corners if you do not get good coverage or good adhesion, then you may have a fast diffusion path. Therefore, laterally etching the ILD gives a better cap coverage. Laterally pushing those shoulders back so you get better cap coverage is helpful. Once one pulls back the shoulders, then one does not have to directionally pull down all the cap material. There is no need to pull down the cap material in the exemplary embodiment.

Figure 5A:
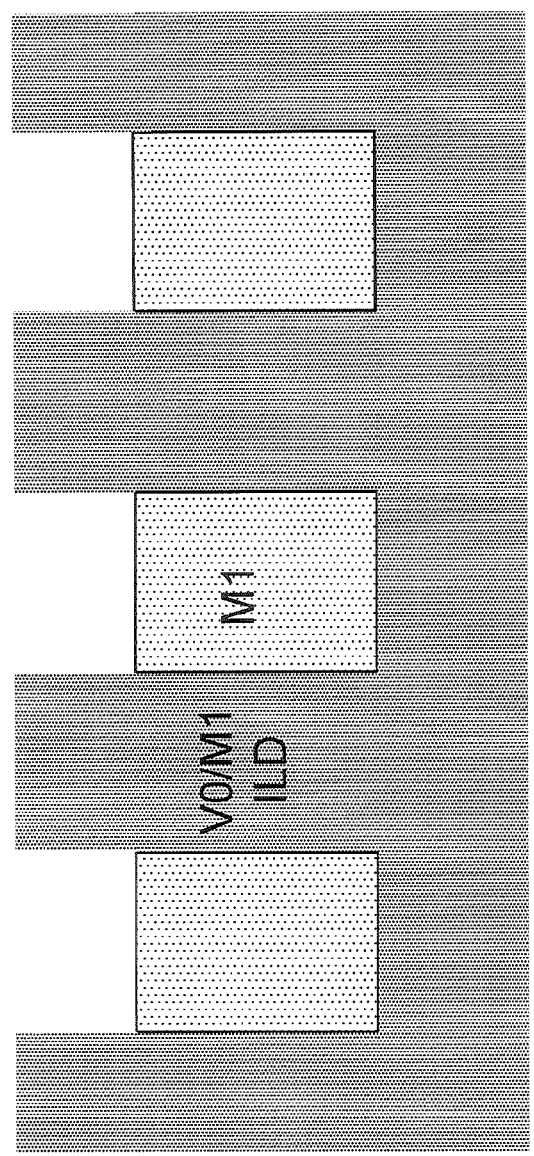
FIG. 5A illustrates the metal recess.

FIG. 5A illustrates the forming of the metal recess which can be made according to know techniques.

Figure 5B:
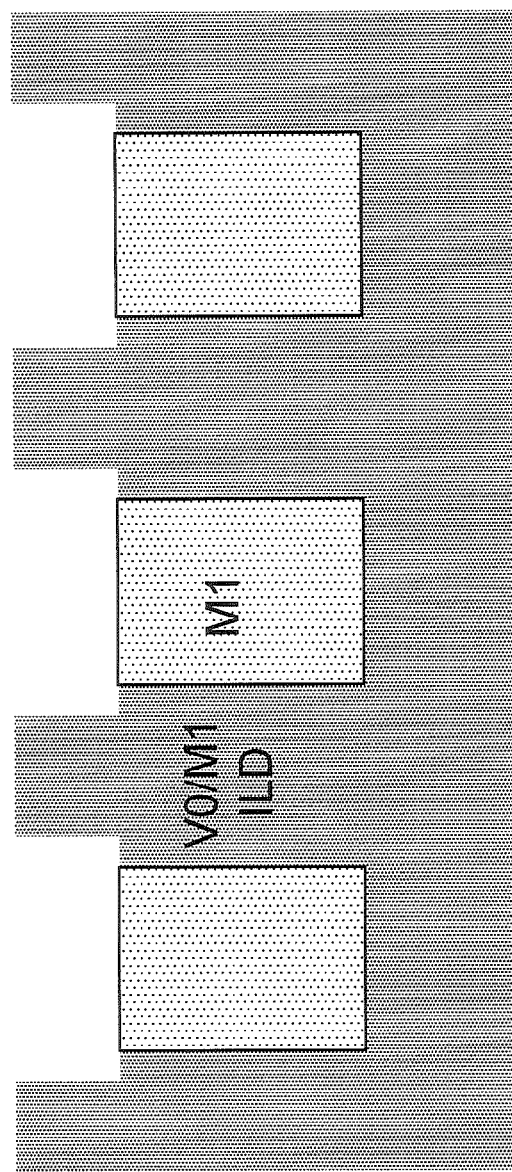
FIG. 5B illustrates the ILD trip of the exemplary embodiment.

FIG. 5B illustrates further the ILD trim of the exemplary embodiment. The ILD trip should be performed prior to the cap deposition. However, there can be some additional options for the trim. One option is to introduce a finite selectivity during the metal recess as seen in FIG. 5A.

Figure 6A:
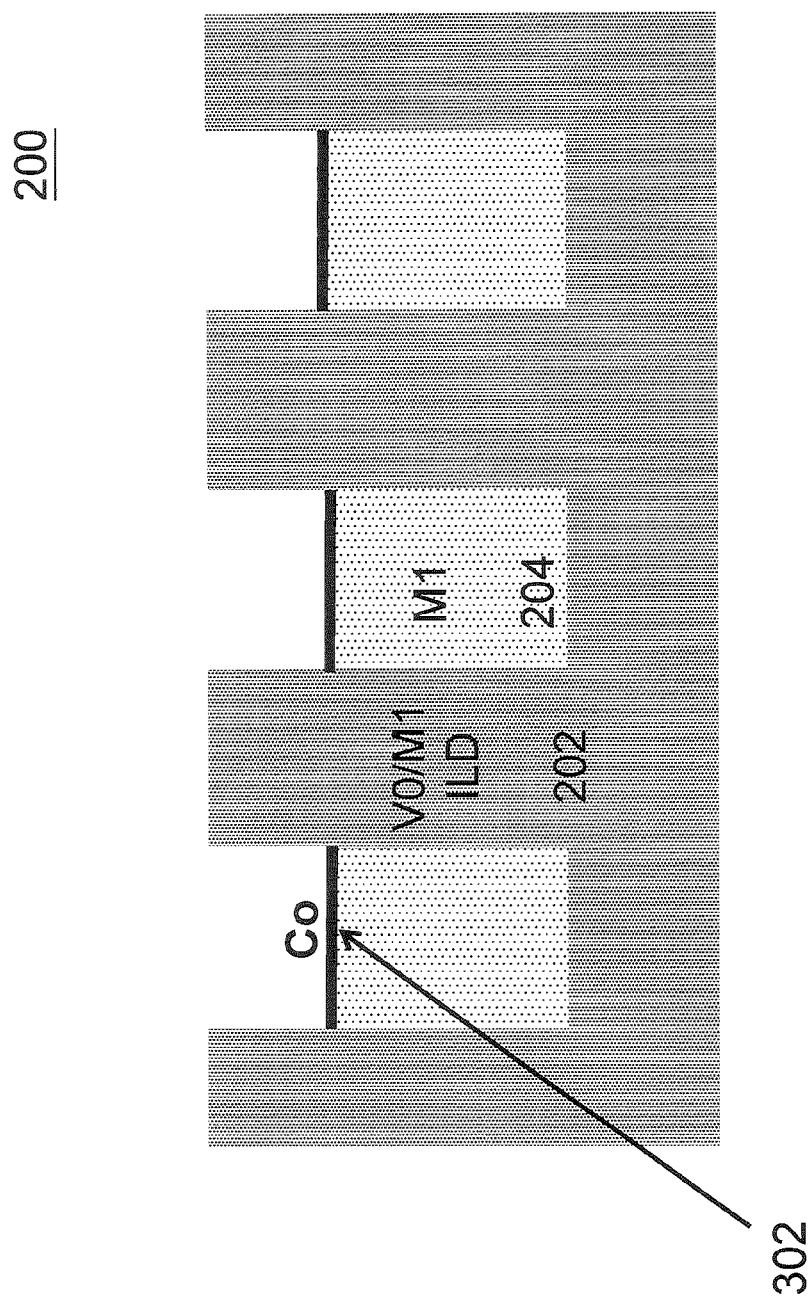
FIG. 6A illustrates operability of the exemplary embodiment.
Figure 6B:
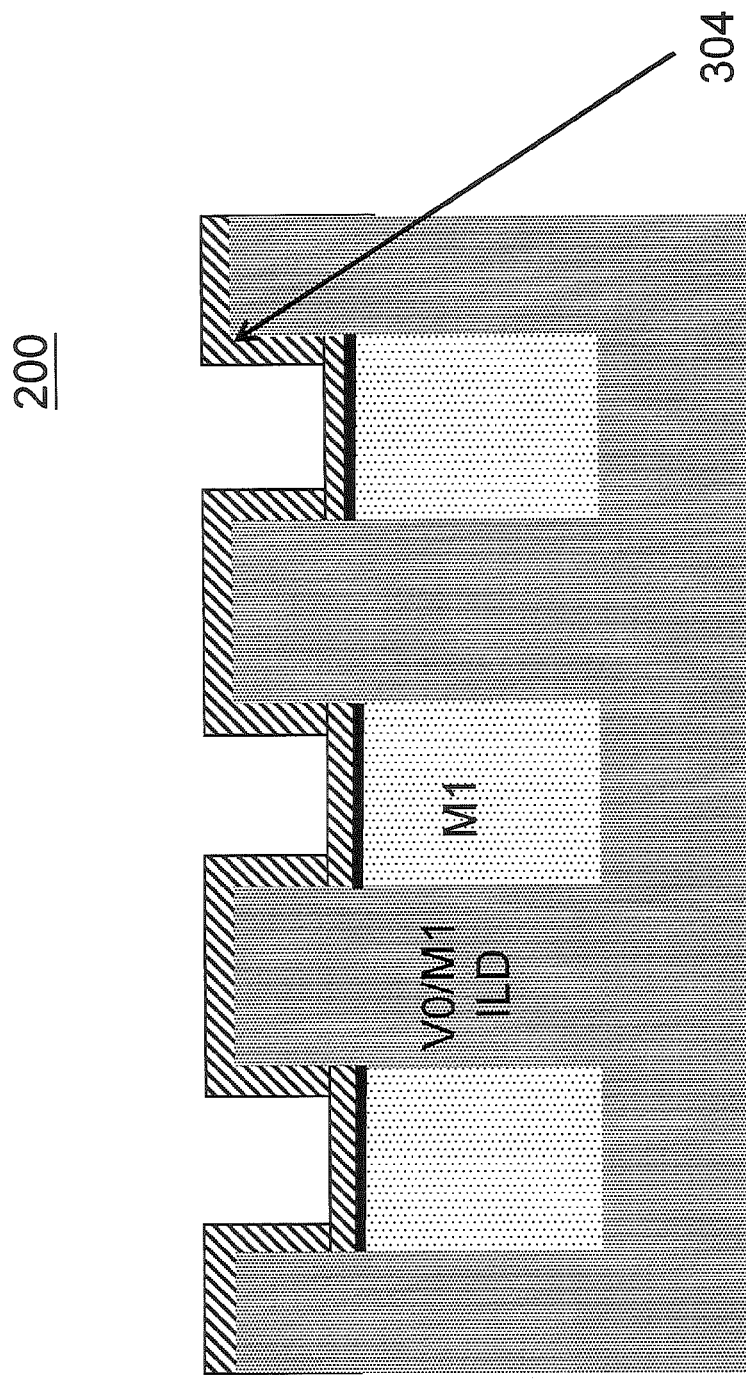
FIG. 6B and FIG. 6C illustrate further operability of the exemplary embodiment.
Figure 6C:
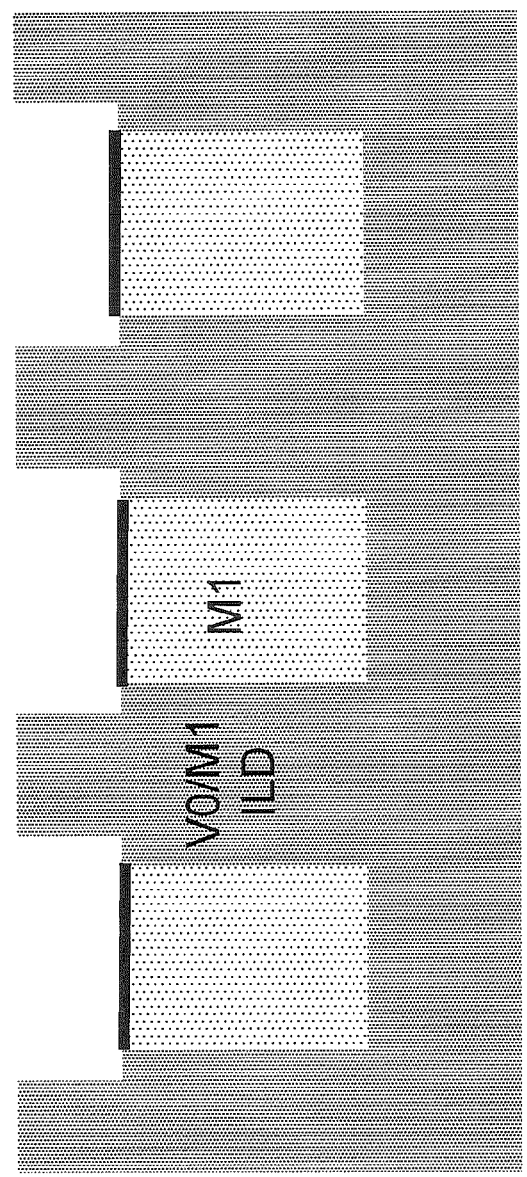

Another option is to trim ILD after metal recess (and assuming recess had very high selectivity to ILD) with example trims shown in FIGS. 6A through 6C.

FIG. 6A illustrates operability of exemplary embodiment. Example of trim is to perform selective Co cap deposition followed by dielectric film deposition. The Co cap deposition 302 is shown as being deposited on the metal layer M1 204. Therefore, it is shown here to passivate and protect the Cu with Co.

FIG. 6B illustrates further operability of exemplary embodiment. Then damage the ILD 202 with or without the dielectric film. One can pre-clean prior to Co cap deposition and prior to dielectric film, or both to damage ILD 202. The dielectric can be a sacrificial nitride 304, for example.

Referring to FIG. 6C, then gentle DHF (dilute HF) is provided to remove damage (and dielectric film 304).

Figure 7A:
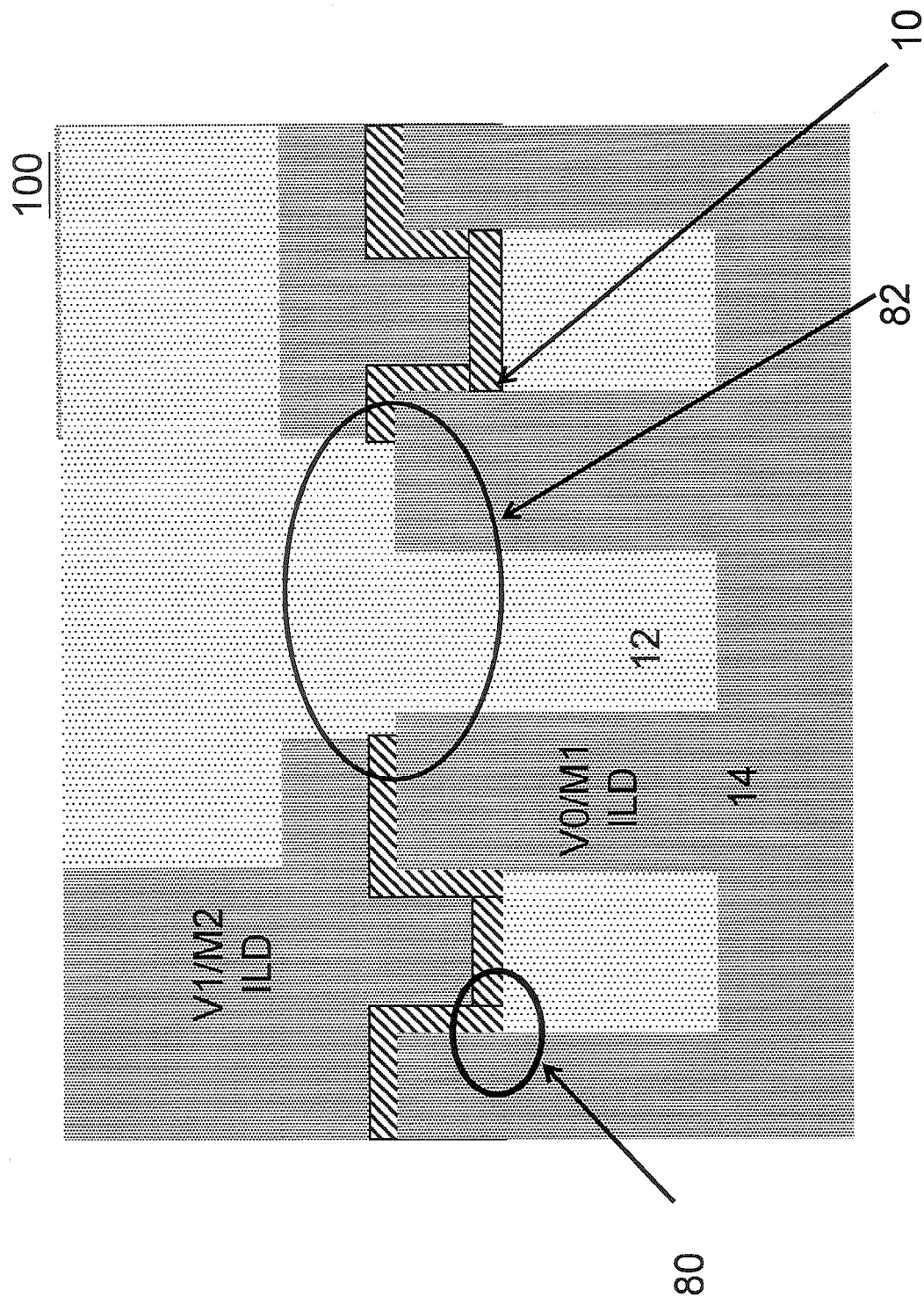
FIG. 7A illustrates a result of the related art for comparison.
Figure 7B:
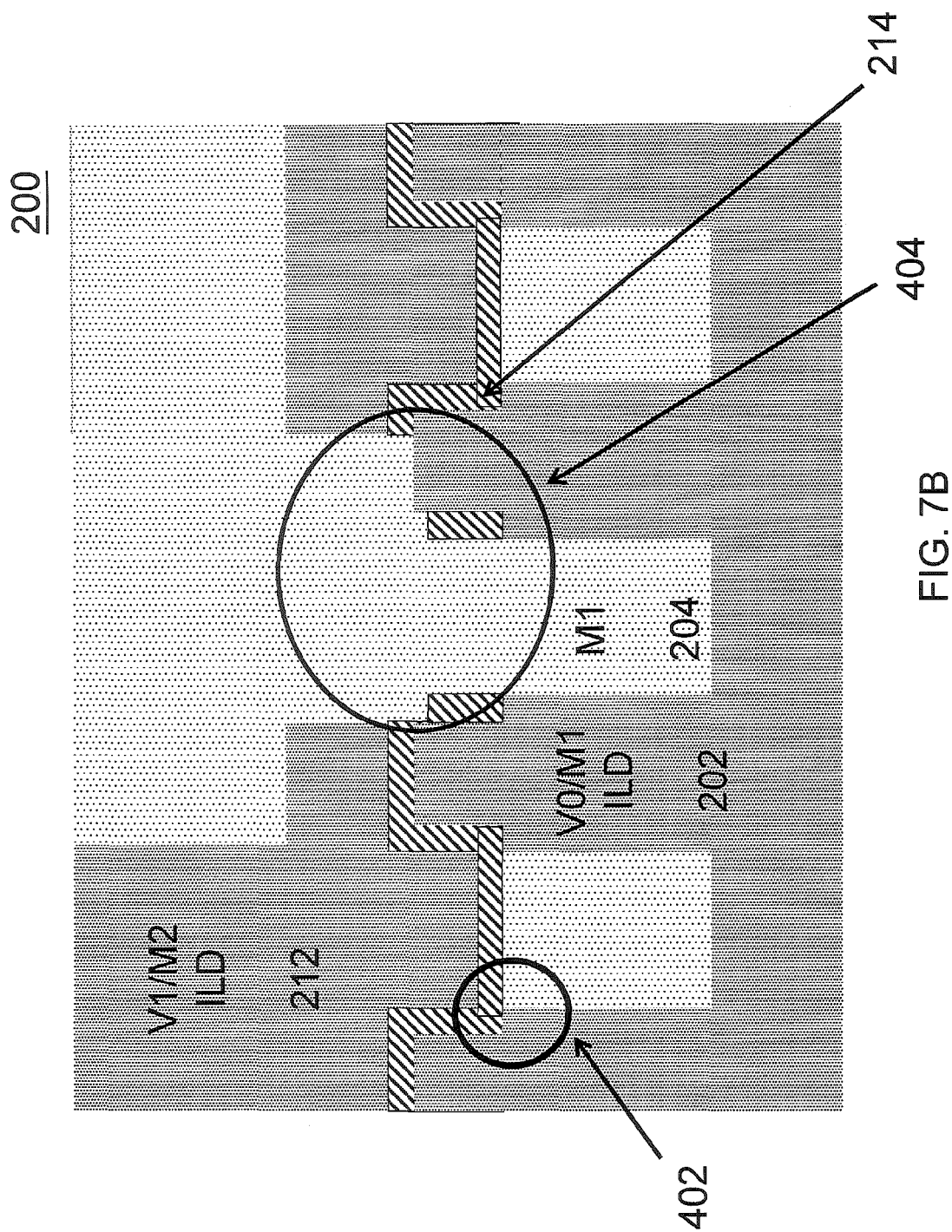
FIG. 7B illustrates the exemplary embodiment for comparison.

FIG. 7A illustrates a result of the related art for comparison. FIG. 7B illustrates the final structure in exemplary embodiment. The advantages over the prior art are shown in further detail. One additional step is added from the related art, is that the ILD trim is made prior to cap deposition. This greatly simplifies the FAV RIE sequences, especially the cap open etch. This also improves barrier cap coverage on prior metal lines and improves EM.

In addition, as seen in comparison of FIGS. 7A and 7B, the final structures are different. The circled portion 80 and 402 shows the edges of the cap layer is different. In the related art, there is sharp edge at the point 80 where the metal layer 12 at level M1 cap layer 10, ILD 14 and cap 12 all meet. However, as seen in FIG. 7B, from the lateral trimming, a shoulder for extra support is created as seen in encircled area 402.

Additionally, as seen in encircled area 82, there is no additional support provided by the cap layer 10 around where the metal layer 12 is extended to complete the metallization. However, in encircled area 404, it can be seen the additional lining of the cap layer 214 on the shoulders of the ILD 202. As mentioned above, these structural differences greatly simplify the FAV RIE sequences, especially cap open etch. They also improve barrier cap coverage on prior metal lines and improve EM.

The Cap 214 overlapping line corners as seen in encircles area 402 provides for more robust Cu passivation, and improved EM. The Cap 214 lining via sidewall in encircled area 404 provides a process without sacrificing via contact area and improved FAV performance.

Figure 8A:
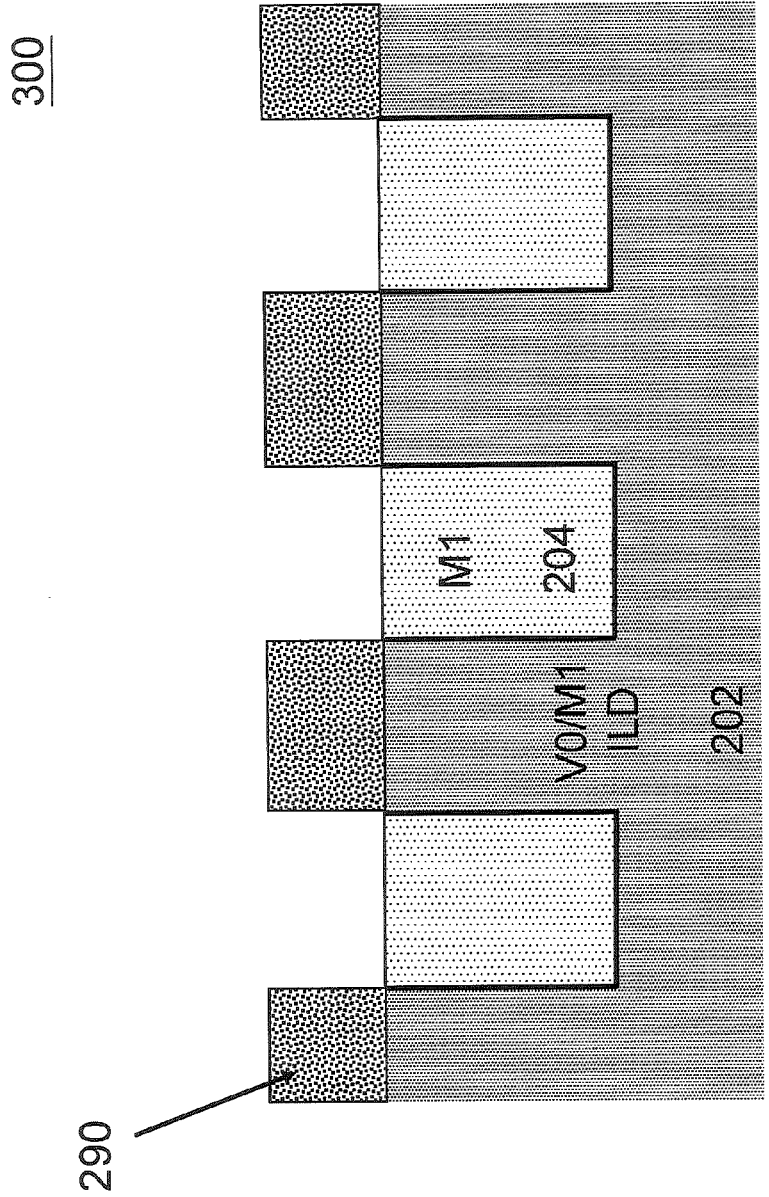
FIG. 8A illustrates another exemplary embodiment showing a growth of a dielectric material.
Figure 8B:
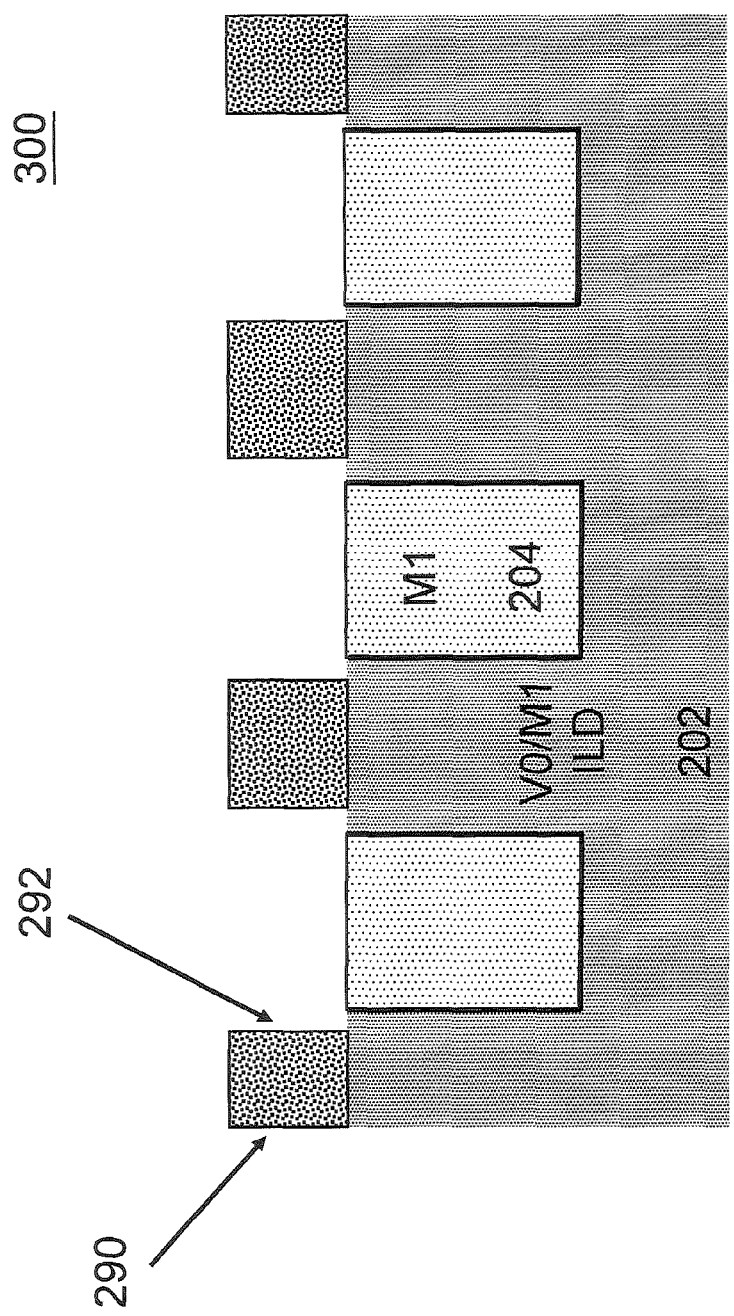
FIG. 8B illustrates the lateral trimming in the other exemplary embodiment.
Figure 8C:
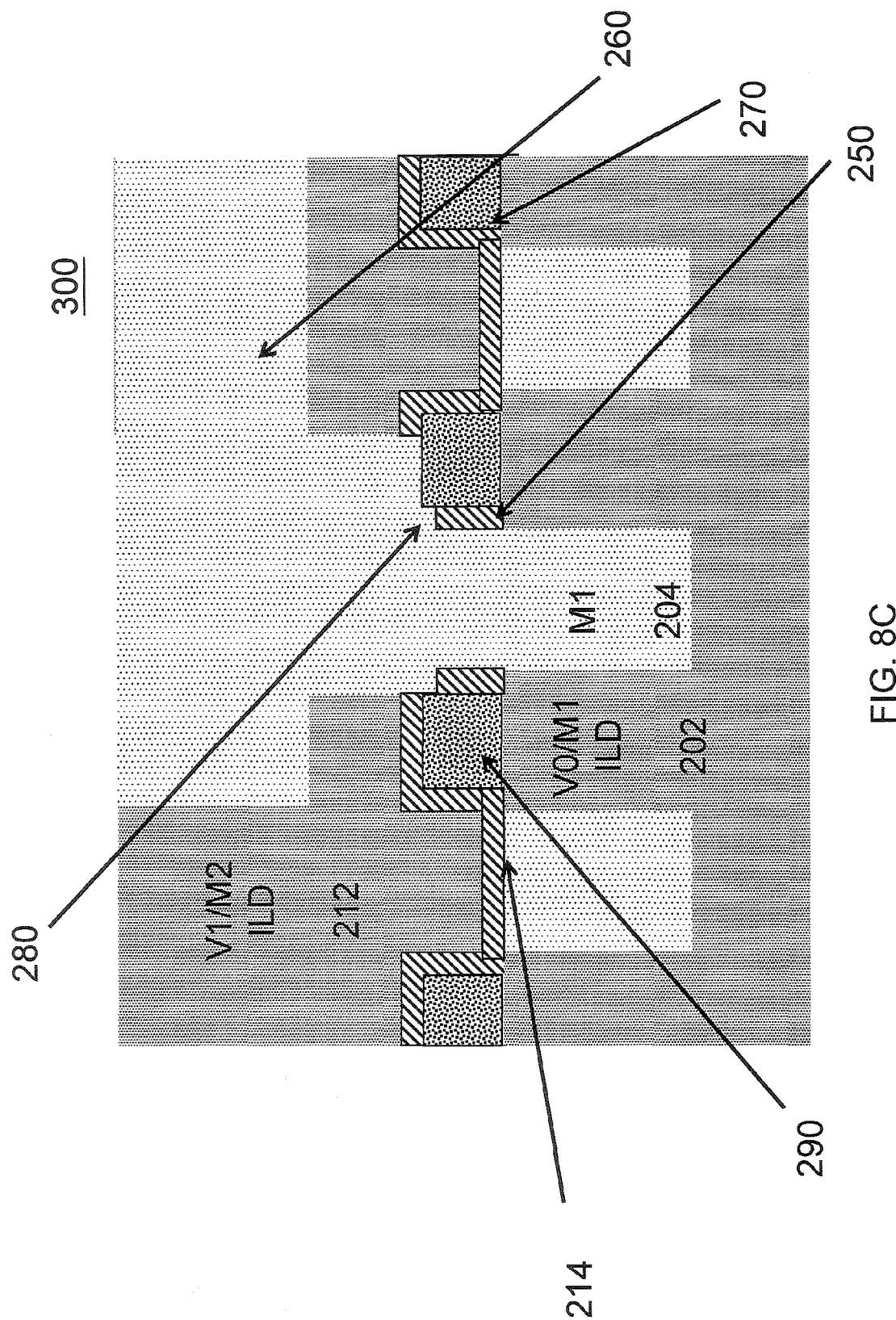
FIG. 8C illustrates a final structure in the other exemplary embodiment.

FIGS. 8A through 8C illustrate another exemplary embodiment as referenced in FIGS. 3A through 3C. Therefore, alternatively, instead of forming a metal recess as seen in FIG. 3A, a dielectric can be selectively grown. Therefore, as seen in FIG. 8A, a dielectric is selectively grown via a selective deposition of a dielectric 290. The dielectric 290 can be formed from the dielectric material ILD 202 or a different dielectric material. Then, the selectively deposited dielectric material 290 is then laterally trimmed as seen in area 292 in FIG. 8B. Each of the deposited materials 290 can be laterally trimmed. Trimming this selective portion 292 would yield similar benefits but a different structure than the structure formed in FIG. 3. FIG. 8C illustrates the final semiconductor structure 300.

Additionally, the present invention reduces the worst-case spacing variation significantly which helps to avoid problems of the related where overlay errors result in reduced spacing between the via and the metal level below, and therefore increasing the dielectric field.

The many features and advantages of the invention are apparent from the detailed specification, and thus, it is intended by the appended claims to cover all such features and advantages of the invention that fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

The invention claimed is:

1. A method of forming fully aligned vias in a semiconductor device, the method comprising:
   forming an Mx level interconnect line embedded in an Mx interlevel dielectric (ILD);
   recessing the Mx level interconnect line below the Mx interlevel dielectric or selectively depositing a dielectric on the Mx interlevel dielectric;
   laterally etching the exposed upper portion of the Mx interlevel dielectric bounding the recess or laterally etching the selectively deposited dielectric;
   depositing a dielectric cap layer and an Mx+1 level interlevel dielectric on top of the Mx interlevel dielectric; and
   forming a via opening.

2. The method according to claim 1, wherein the forming of the via opening further comprises forming the via opening through the Mx+1 interlevel dielectric and the cap such that a vertical spacer made of the cap is positioned surrounding the bottom portion of the via opening to fully align the via opening.

3. The method according to claim 1, wherein the forming of the via opening further comprises forming the via opening through the Mx+1 interlevel dielectric and the cap such that a vertical spacer made of the cap is positioned surrounding the bottom portion of the via opening, the via opening is constrained by the vertical spacer perpendicular to a trench below.

4. The method according to claim 1,
   wherein the forming of the via opening further comprises forming a Vx via opening through the Mx+1 interlevel dielectric and the cap,
   wherein a vertical spacer made of the cap is positioned surrounding the bottom portion of the Vx via opening and the Vx via opening being fully aligned within the width of an Mx line by virtue of the vertical spacer, and
   wherein the Vx via opening is at a Vx level and Mx+1 interlevel dielectric is at an Mx+1 level, where x is an integer.

5. The method according to claim 1, wherein the forming of the via opening is in back end of line (BEOL) and,
   wherein after recessing the Mx level interconnect line, the MX interlevel dielectric bounding the recess is laterally etched.

6. The method according to claim 1, wherein performing a trim of the interlevel dielectric or the dielectric layer is through the lateral etching before the depositing of the dielectric cap layer.

7. The method according to claim 6, wherein the trim includes trimming the interlevel dielectric after metal recess with a finite selectivity.

8. A semiconductor device, comprising:
   an Mx interlevel dielectric (ILD);
   an Mx level interconnect line embedded in the Mx interlevel dielectric, the Mx interconnect line being recessed below the Mx interlevel dielectric, the Mx interlevel dielectric including an exposed upper portion bounding the recess;
   a dielectric cap layer deposited on the Mx interlevel dielectric and the Mx level interconnect line; and
   an Mx+1 level ILD formed on the Mx interlevel dielectric and the Mx level interconnect line.

9. The semiconductor device according to claim 8, wherein a via opening through the Mx+1 interlevel dielectric and the dielectric cap layer is formed such that a vertical spacer made of the cap is positioned surrounding the bottom portion of the via opening to fully align the via.

10. The semiconductor device according to claim 9, wherein the via opening is formed through the Mx+1 interlevel dielectric and the cap such that a vertical spacer made of the cap is positioned surrounding the bottom portion of the via opening.

11. The semiconductor device according to claim 8,
    wherein the via opening is formed by a Vx via opening through the Mx+1 interlevel dielectric and the cap such that a vertical spacer made of the cap is positioned surrounding the bottom portion of the Vx via opening, and
    wherein the Vx via opening is aligned within the width of the Mx line by virtue of the cap spacer in the recess.

12. The semiconductor device according to claim 8, forming the via opening is in back end of line (BEOL) for deposit of Mx level interconnect line.

13. The semiconductor device according to claim 8,
    wherein the Mx level interconnect line is deposited in a via opening, and
    wherein performing a trim of the interlevel dielectric is through the lateral etching before the depositing of the dielectric cap layer.

14. The semiconductor device according to claim 13, wherein the trim includes trimming the interlevel dielectric after metal recess with a finite selectivity,
    wherein the dielectric cap partially fills the recessed Mx interconnect line, and
    wherein an exposed upper portion of the Mx interlevel dielectric bounding the recess is laterally etched.

15. A semiconductor device, comprising:
    an Mx interlevel dielectric (ILD);
    an Mx level interconnect line embedded in the Mx interlevel dielectric;
    a dielectric layer selectively formed on the Mx interlevel dielectric and laterally etched to bound a via;
    a dielectric cap layer deposited on the Mx interlevel dielectric, the via, the Mx level interconnect line, and the dielectric layer; and
    an Mx+1 level ILD formed on the Mx interlevel dielectric, the dielectric layer, and the Mx level interconnect line.

16. The semiconductor device according to claim 15, wherein the dielectric layer comprises the Mx interlevel dielectric or a different dielectric material.

17. The semiconductor device according to claim 15, wherein the dielectric layer is selectively grown from the Mx interlevel dielectric or a different dielectric material and then laterally etched to the expose the dielectric layer above the Mx interlevel dielectric.

18. The semiconductor device according to claim 15, wherein the dielectric layer forms the via opening through the Mx+1 interlevel dielectric and the cap such that a vertical spacer made of the cap is positioned surrounding the bottom portion of the via opening to fully align the via.

19. The semiconductor device according to claim 15, wherein the dielectric layer forms a Vx via opening through the Mx+1 interlevel dielectric and the cap such that a vertical spacer made of the cap is positioned surrounding the bottom portion of the Vx via opening and the Vx via being thus fully aligned within the width of the Mx line by virtue of the cap spacer.

20. The semiconductor device according to claim 15, wherein the dielectric layer is selectively formed and laterally etched above the Mx interlevel dielectric to provide spaces there between for the dielectric cap layer and the Mx+1 level ILD.

\* \* \* \* \*